(12) United States Patent
Itoh et al.

(10) Patent No.: US 11,488,813 B2
(45) Date of Patent: Nov. 1, 2022

(54) CLEANING METHOD

(71) Applicant: TOKYO ELECTRON LIMITED, Tokyo (JP)

(72) Inventors: Satoshi Itoh, Nirasaki (JP); Takafumi Nogami, Nirasaki (JP); Eita Yokokura, Nirasaki (JP); Reisa Matsumoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 44 days.

(21) Appl. No.: 16/972,784

(22) PCT Filed: May 30, 2019

(86) PCT No.: PCT/JP2019/021541
§ 371 (c)(1),
(2) Date: Dec. 7, 2020

(87) PCT Pub. No.: WO2019/239912
PCT Pub. Date: Dec. 19, 2019

(65) Prior Publication Data
US 2021/0249240 A1    Aug. 12, 2021

(30) Foreign Application Priority Data
Jun. 11, 2018  (JP) .............................. JP2018-111429

(51) Int. Cl.
*C23C 16/44*    (2006.01)
*H01J 37/32*    (2006.01)
(Continued)

(52) U.S. Cl.
CPC ...... *H01J 37/32862* (2013.01); *B08B 7/0035* (2013.01); *C23C 16/4404* (2013.01); *C23C 16/4405* (2013.01); *C23C 16/511* (2013.01); *H01J 37/32504* (2013.01); *H01J 37/32192* (2013.01)

(58) Field of Classification Search
CPC ............ C23C 16/4404; C23C 16/4405; C23C 16/511
See application file for complete search history.

(56) References Cited

U.S. PATENT DOCUMENTS 6,079,426 A  *  6/2000  Subrahmanyam ........................... C23C 16/4405 134/1.1
6,491,042 B1 * 12/2002  Young ....................... B08B 7/00 134/1.1

(Continued)

FOREIGN PATENT DOCUMENTS

JP    2008-211099 A      9/2008
JP    2009-57604    *   3/2009  ............ C23C 16/44
(Continued)

OTHER PUBLICATIONS

Yi, Chang Heon, et al., "Oxide surface cleaning by an atmospheric pressure plasma". Surface and Coatings Technology, vols. 177-178, Jan. 30, 2004, pp. 711-715.*

(Continued)

*Primary Examiner* — Bret P Chen
(74) *Attorney, Agent, or Firm* — Nath, Goldberg & Meyer; Jerald L. Meyer; Tanya E. Harkins

(57) ABSTRACT

A method for cleaning a microwave plasma processing apparatus which has a processing container and a microwave radiation part, and which has a window part provided at a position where the microwave radiation part is disposed in the processing container, includes a cleaning step of adjusting a pressure to a pressure corresponding to a size of a cleaning target part, among parts within the processing container including a wall surface of the processing container, the microwave radiation part, and the window part, while supplying a cleaning gas, and performing a cleaning process using plasma of the cleaning gas.

12 Claims, 6 Drawing Sheets

(51) Int. Cl.
 B08B 7/00 (2006.01)
 C23C 16/511 (2006.01)

(56) References Cited

U.S. PATENT DOCUMENTS

| | | | | |
|---|---|---|---|---|
| 8,252,098 | B2* | 8/2012 | Mayer | B01D 46/0032 96/111 |
| 9,508,546 | B2* | 11/2016 | Toyoda | C23C 16/4557 |
| 2004/0238820 | A1* | 12/2004 | Sakama | H01L 27/1214 438/149 |
| 2007/0163617 | A1* | 7/2007 | Ozaki | H01J 37/32935 700/121 |
| 2011/0212274 | A1* | 9/2011 | Selsley | H01L 21/76862 427/540 |
| 2013/0333571 | A1* | 12/2013 | Sundaram | F16K 11/074 96/108 |
| 2014/0060322 | A1* | 3/2014 | Wanni | B01D 53/047 29/460 |

FOREIGN PATENT DOCUMENTS

| | | |
|---|---|---|
| JP | 2011-77442 A | 4/2011 |
| JP | 2013-102048 A | 5/2013 |
| JP | 2014-216539 A | 11/2014 |
| WO | 2013/092770 A1 | 6/2013 |

OTHER PUBLICATIONS

Lisco, F., et al., "Atmospheric-pressure plasma surface activation for solution processed photovoltaic devices". Solar Energy 146 (2017) 287-297.*

Dartevelle, Caroline, et al., "Low pressure plasma treatment for improving the strength and durability of adhesively bonded aluminium joints". Surface and Coatings Technology, vols. 173, (2003), pp. 249-258.*

Hicks, Robert R., et al., "Atmospheric-Pressure Plasma Cleaning of Contaminated Surfaces". US Department of Energy Report, pp. 1-22. No date or citation information available.*

Petasch, W., et al., "Low-pressure plasma cleaning: a process for precision cleaning applications". Surface and Coatings Technology 97 (1997) 176-181.*

Belkind, A., et al., "Plasma Cleaning of Surfaces". Vacuum Technology & Coating 2008, pp. 1-11.*

Abarro, Ghizelle Jane E., et al., "Batch Microwave Plasma Cleaning for Robustification of Automotive Devices". 38th International Electronics Manufacturing Technology Conference (IEMT), 2018, pp. 1-7.*

* cited by examiner

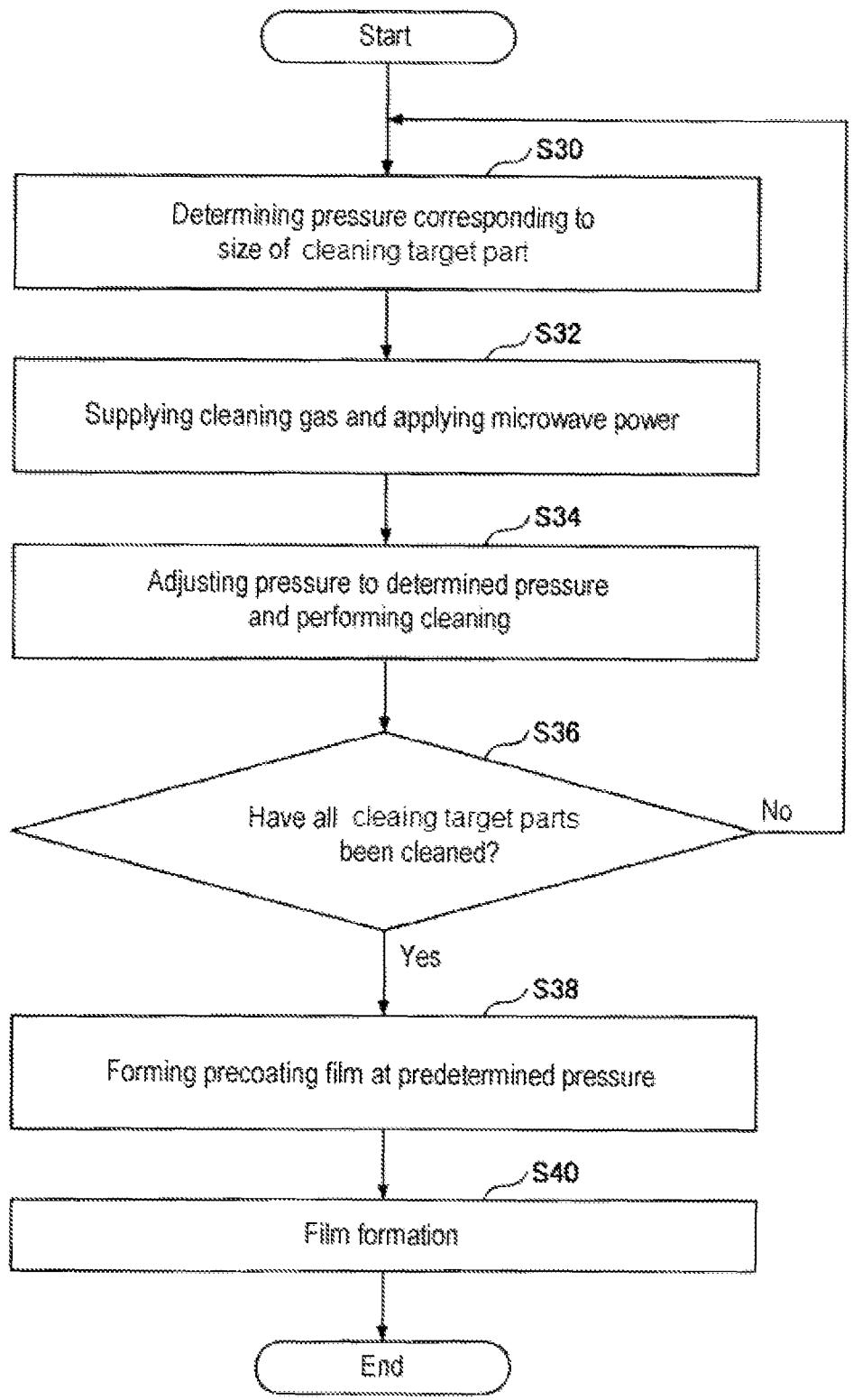

CLEANING METHOD

This is a National Phase Application filed under 35 U.S.C. 371 as a national stage of PCT/JP2019/021541, filed May 30, 2019, an application claiming the benefit of Japanese Application No. 2018-111429, filed Jun. 11, 2018, the content of each of which is hereby incorporated by reference in its entirety.

TECHNICAL FIELD

The present disclosure relates to a cleaning method.

BACKGROUND

Patent Document 1 proposes a cleaning method including a first step of generating plasma while supplying a cleaning gas into a processing container so as to maintain the interior of the processing container at a first pressure and to perform cleaning, and a second step of maintaining the interior of the processing container at a second pressure higher than the first pressure and performing cleaning.

Patent Document 2 discloses a cleaning method including step 1 of cleaning the interior of a processing chamber and a member accommodated in the processing chamber, step 2 of cleaning the lower portion of each of the interior of the processing chamber and the member, and step 3 of cleaning the interior of a gas supply path. Step 1 is performed by setting the pressure in a first pressure zone and the temperature in a first temperature zone, and supplying a cleaning gas from the gas supply path. Step 2 is performed by setting the pressure in a second pressure zone higher than the first pressure zone and supplying the cleaning gas from the gas supply path while raising the temperature in a second temperature zone higher than the first temperature zone. Step 3 is performed by setting the pressure in a third pressure zone lower than the second pressure zone and supplying the cleaning gas from the gas supply path while maintaining the temperature in the second temperature zone.

PRIOR ART DOCUMENTS

Patent Documents

Patent Document 1: Japanese Laid-Open Patent Publication No. 2008-211099
Patent Document 2: Japanese Laid-Open Patent Publication No. 2014-216539

The present disclosure provides a technique capable of performing cleaning in an effective manner.

SUMMARY

According to an aspect of the present disclosure, there is provided a method for cleaning a microwave plasma processing apparatus which has a processing container and a microwave radiation part, and which has a window part provided at a position where the microwave radiation part is disposed in the processing container, the method including: a cleaning step of adjusting an internal pressure of the processing container to a pressure corresponding to a size of a cleaning target part, among parts within the processing container including a wall surface of the processing container, the microwave radiation part, and the window part, while supplying a cleaning gas, and performing a cleaning process using plasma of the cleaning gas.

According to an aspect, it is possible to perform cleaning in an effective manner.

BRIEF DESCRIPTION OF DRAWINGS

FIG. 7 is a flowchart illustrating an example of a cleaning process according to a modification of the embodiment.

DETAILED DESCRIPTION

Figure 1:
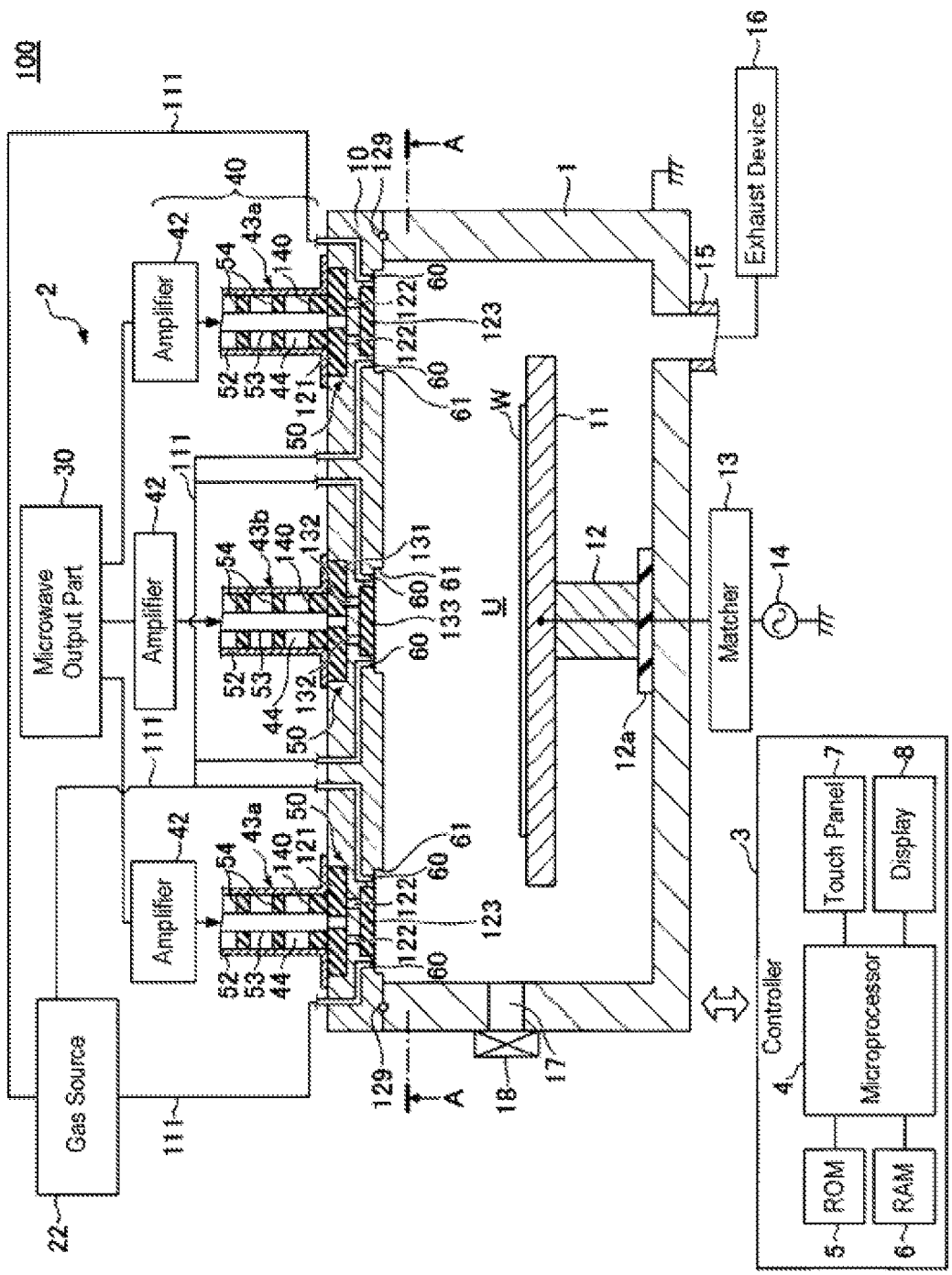
FIG. 1 is a view illustrating an example of a microwave plasma processing apparatus according to an embodiment.

Hereinafter, embodiments for executing the present disclosure will be described with reference to drawings. In the specification and drawings, constituent elements that are substantially the same will be denoted by the same reference numerals, and redundant descriptions thereof will be omitted.

[Microwave Plasma Processing Apparatus]

FIG. 1 is a cross-sectional view illustrating an example of a microwave plasma processing apparatus 100 according to an embodiment. The microwave plasma processing apparatus 100 has a processing container 1 in which a wafer W is accommodated. The microwave plasma processing apparatus 100 is an example of a plasma processing apparatus that performs a predetermined plasma processing on the wafer W using surface wave plasma formed on a ceiling surface of the processing container 1 by microwaves. Examples of the predetermined plasma processing may include a film forming process, an etching process, or an ashing process.

The microwave plasma processing apparatus 100 includes the processing container 1, a microwave plasma source 2, and a controller 3. The processing container 1 is a substantially cylindrical container made of a metallic material such as aluminum, stainless steel or the like, and is grounded.

The processing container 1 has a main body 10, and forms a plasma processing space therein. The main body 10 is a disc-shaped ceiling plate that constitutes the ceiling of the processing container 1. A support ring 129 is provided on a contact surface between the processing container 1 and the main body 10, whereby the interior of the processing container 1 is hermetically sealed.

The microwave plasma source 2 has a microwave output part 30, a microwave transmission part 40, and a microwave radiation part 50. The microwave output part 30 outputs microwaves through a plurality of paths. The microwaves are introduced into the processing container 1 through the microwave transmission part 40 and the microwave radiation part 50. The gas supplied into the processing container 1 is excited by an electric field of introduced microwaves, whereby surface wave plasma is formed.

A stage 11 on which the wafer W is placed is provided inside the processing container 1. The stage 11 is supported by a cylindrical support member 12, which is provided upright on the center of the bottom portion of the processing container 1 via an insulating member 12a. Examples of a material forming the stage 11 and the support member 12 may include a metal such as aluminum having an alumite-treated (anodized) surface or the like, and an insulating member (ceramic or the like) having a high-frequency electrode provided therein. The stage 11 may be provided with an electrostatic chuck for electrostatically attracting the wafer W, a temperature control mechanism, and a gas flow path for supplying a heat transfer gas to a rear surface of the wafer W.

A high-frequency bias power supply 14 is connected to the stage 11 via a matcher 13. By supplying high-frequency power to the stage 11 from the high-frequency bias power supply 14, the ions in plasma are drawn into the side of the wafer W. The high-frequency bias power supply 14 may be omitted depending on the characteristics of plasma processing.

An exhaust pipe 15 is connected to the bottom portion of the processing container 1. An exhaust device 16 including a vacuum pump is connected to the exhaust pipe 15. When the exhaust device 16 is operated, the interior of the processing container 1 is exhausted so that the interior of the processing container 1 is quickly depressurized to a predetermined degree of vacuum. The side surface of the processing container 1 is provided with a loading/unloading port 17 for loading/unloading the wafer W therethrough and a gate valve 18 for opening/closing the loading/unloading port 17.

The microwaves output from the microwave output part 30 are transmitted to the microwave transmission part 40. A central microwave inlet 43b of the microwave transmission part 40 is arranged in the center of the main body 10. Six peripheral microwave inlets 43a (only two of which are illustrated in FIG. 1) are arranged in the periphery of the main body 10 at regular intervals in the circumferential direction. Each of the central microwave inlet 43b and the six peripheral microwave inlets 43a has a function of introducing microwaves output from a respective amplifier 42 into the microwave radiation part 50, and an impedance-matching function. Hereinafter, the peripheral microwave inlets 43a and the central microwave inlet 43b are also collectively referred to as a microwave inlet 43.

Figure 2:
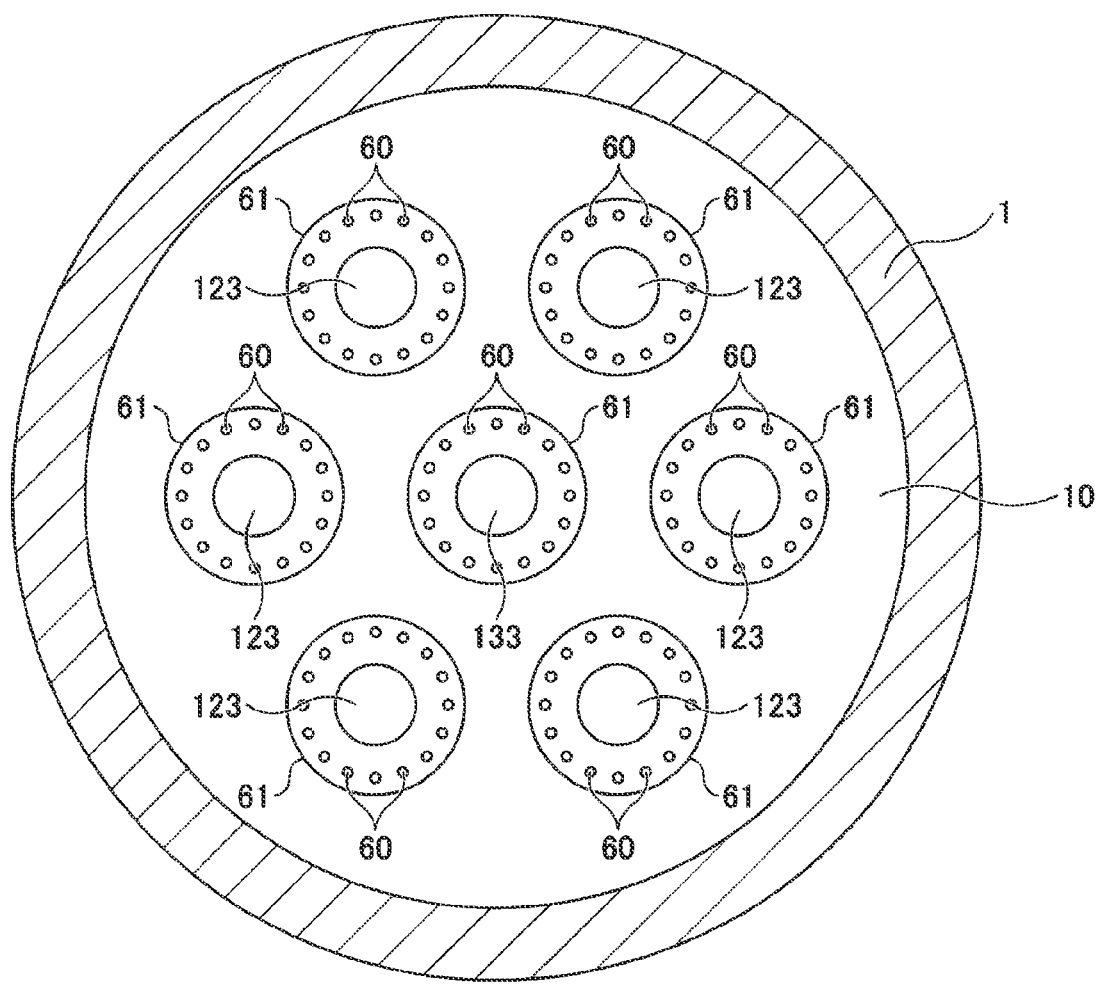
FIG. 2 is a view illustrating an example of a ceiling surface of the microwave plasma processing apparatus according to the embodiment.

As illustrated in FIG. 1 and FIG. 2 showing a cross section taken along line A-A in FIG. 1, six dielectric windows 123 are arranged inside the main body 10 below the six peripheral microwave inlets 43a. Further, one dielectric window 133 is arranged inside the main body 10 below the central microwave inlet 43b. The numbers of peripheral microwave inlets 43a and dielectric windows 123 are not limited to six, and may be two or more. However, the numbers of peripheral microwave inlets 43a and dielectric windows 123 are preferably three or more, and may be, for example, three to six. It is preferable to provide one central microwave inlet 43b, but the central microwave inlet 43b may be omitted.

Returning to FIG. 1, the microwave radiation part 50 radiates microwaves into the processing container 1. The microwave radiation part 50 has dielectric ceiling plates 121 and 131, slots 122 and 132, and the dielectric windows 123 and 133. The dielectric ceiling plates 121 and 131 are made of a disc-shaped dielectric material that transmits microwaves, and are arranged on the top surface of the main body 10. The dielectric ceiling plates 121 and 131 are made of, for example, quartz, ceramic such as alumina ($Al_2O_3$), a fluorine-based resin such as polytetrafluoroethylene, or a polyimide-based resin, which has a dielectric constant higher than a vacuum. Therefore, each of the dielectric ceiling plates 121 and 131 has a function of making the wavelength of the microwave transmitted through each of the dielectric ceiling plates 121 and 131 shorter than that of the microwave propagating in a vacuum, thereby reducing the size of an antenna including the slots 122 and 132.

Under the dielectric ceiling plates 121 and 131, the dielectric windows 123 and 133 are arranged inside the main body 10 via the slots 122 and 132 formed in the main body 10. The dielectric windows 123 and 133 are made of, for example, quartz, ceramic such as alumina ($Al_2O_3$), a fluorine-based resin such as polytetrafluoroethylene, or a polyimide-based resin. Each of the microwave radiation parts 50 including the dielectric windows 123 and 133 is exposed inside a respective window part 61, which is recess formed in the rear surface of the main body 10, and radiates the microwaves into a plasma generation space U.

In each of the peripheral microwave inlets 43a and the central microwave inlet 43b, a cylindrical outer conductor 52 and a rod-shaped inner conductor 53 provided at the center of the outer conductor 52 are arranged in a coaxial relationship with each other. Microwave power is supplied between the outer conductor 52 and the inner conductor 53. A space between the outer conductor 52 and the inner conductor 53 forms a microwave transmission path 44 through which the microwaves propagate toward the microwave radiation part 50.

Each of the peripheral microwave inlets 43a and the central microwave inlet 43b is provided with a slug 54 and an impedance adjustment member 140 located at the front end thereof. The slug 54 is made of a dielectric material, and has a function of matching the impedance of an internal load (plasma) of the processing container 1 with the characteristic impedance of the microwave power supply in the microwave output part 30 through the movement of the slug 54. The impedance adjustment member 140 is made of a dielectric material, and is configured to adjust the impedance of the microwave transmission path 44 based on a relative dielectric constant thereof.

As illustrated in FIGS. 1 and 2, a plurality of gas holes 60 is provided inside each of the window parts 61 to be arranged in an annular shape outward of the dielectric window 123 or 133. The gas supplied from the gas source 22 passes through gas supply pipes 111 and is supplied into the processing container 1 in the form of a shower from the gas holes 60. An example of the gas may include a gas for plasma generation such as an Ar gas or the like, a gas of being easily decomposed with high energy such as an $O_2$ gas, a $N_2$ gas or the like, and a processing gas such as a silane gas or the like.

Each part of the microwave plasma processing apparatus 100 is controlled by the controller 3. The controller 3 has a microprocessor 4, a read-only memory (ROM) 5, and a random access memory (RAM) 6. The ROM 5 and the RAM 6 store process sequences of the microwave plasma processing apparatus 100 and process recipes as control parameters. The microprocessor 4 controls each part of the microwave plasma processing apparatus 100 based on the process sequences and the process recipes. In addition, the controller 3 has a touch panel 7 and a display 8, and is capable of displaying inputs and results when performing a predetermined control according to the process sequences and the process recipes.

When performing the plasma processing in the microwave plasma processing apparatus 100 configured as described above, first, the wafer W is loaded into the processing container 1 through the loading/unloading port 17 from the opened gate valve 18 in the state of being held on a transfer arm. The gate valve 18 is closed after the loading of the wafer W. When the wafer W is transferred to a position above the stage 11, the wafer W is delivered from the transfer arm to pusher pins. As the pusher pins move downward, the wafer is placed on the stage 11. The interior of the processing container 1 is maintained at a predetermined degree of vacuum by the exhaust device 16. The processing gas is introduced into the processing container 1 from the gas holes 60 in the form of a shower. The microwaves radiated from the microwave radiation part 50 are turned into surface waves of the microwaves and propagate on the ceiling surface. The processing gas is excited by the electric field of the surface waves so that surface wave plasma is generated in the plasma generation space U of the processing container 1. In this way, the wafer W is subjected to the plasma processing.

[Cleaning Target Parts]

Figure 3:
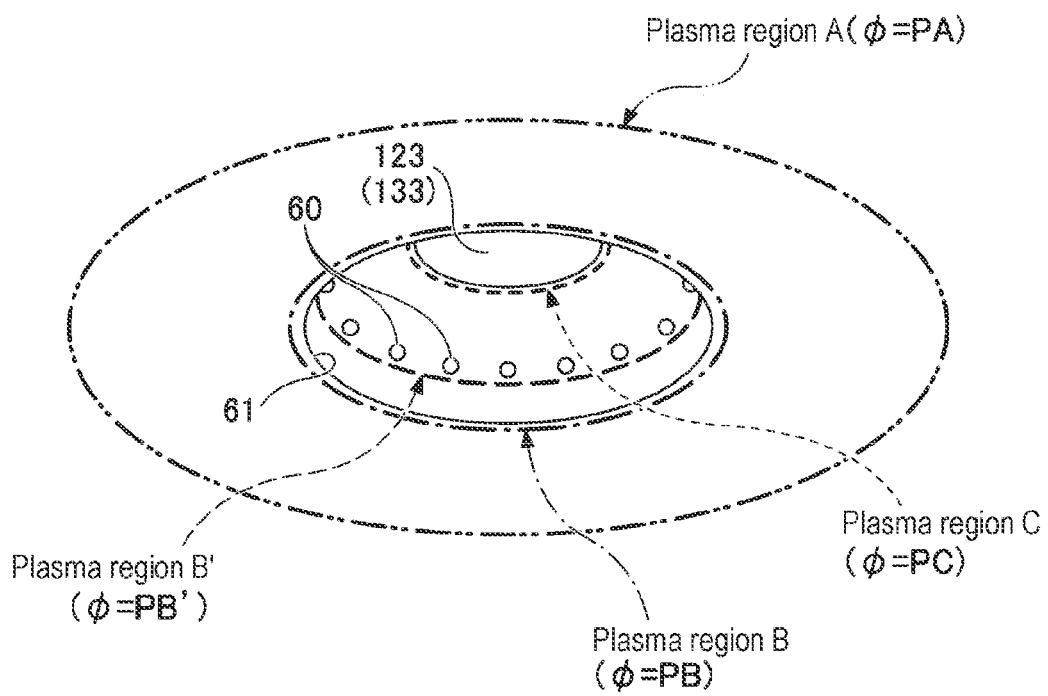
FIG. 3 is a view schematically illustrating a microwave radiation part and a periphery of a window part according to an embodiment.

As described above, in the microwave plasma processing apparatus 100 according to an embodiment, as illustrated in FIG. 3, which is an enlarged perspective view of one of the window parts 61 of FIG. 2, the ceiling surface of the processing container 1 has a structure having a plurality of uneven parts. For example, the window part 61 formed on the rear surface of the main body 10, the dielectric window 123 or 133 exposed from the window part 61, the plurality of gas holes 60 arranged in an annular shape outward of the dielectric window 123 or the like inside the window part 61, and the ceiling surface and side surface within the processing container 1 are examples of the cleaning target parts.

Deposits are likely to be deposited on the uneven portions of the parts themselves and on uneven portions of the outer edges of the parts. For example, deposits are likely to be deposited on the outer edges of the dielectric windows 123 and 133 illustrated in FIG. 3, the plurality of gas holes 60 arranged in an annular shape, the inner surfaces of the window parts 61, and the wall surface of the processing container 1 (including the main body 10).

These deposits are reaction products produced by a pre-coating film and a chemical reaction during plasma processing. The pre-coating film is a film that is coated on the wall surface or the like such that particles are not generated during a film forming process, and is a silicon-containing film such as SiN, $SiO_2$ or the like. It is preferable to remove the deposits every time the film forming process is performed on one sheet of wafer W. When a pre-coating film is formed through a plasma-enhanced chemical vapor deposition (PE-CVD) or the like in the state in which the deposits adhere on the wall surface or the like, a particle reduction effect may be insufficient in a subsequent film forming process. In particular, as illustrated in FIGS. 2 and 3, when particles are generated from the unevenness of the ceiling surface above the wafer W, it is highly possible that the particles will fly onto the wafer W and will cause a decrease in yield.

Thus, assuming that at least one of the parts inside the processing container 1 including the ceiling surface and the side surface of the processing container 1, the dielectric windows 123 and 133, and the window parts 61 is a cleaning target part, deposits on the respective part and the surroundings thereof are removed by the cleaning method according to the embodiment described below. At that time, an internal pressure of the processing container 1 is changed depending on a process.

Figure 4:
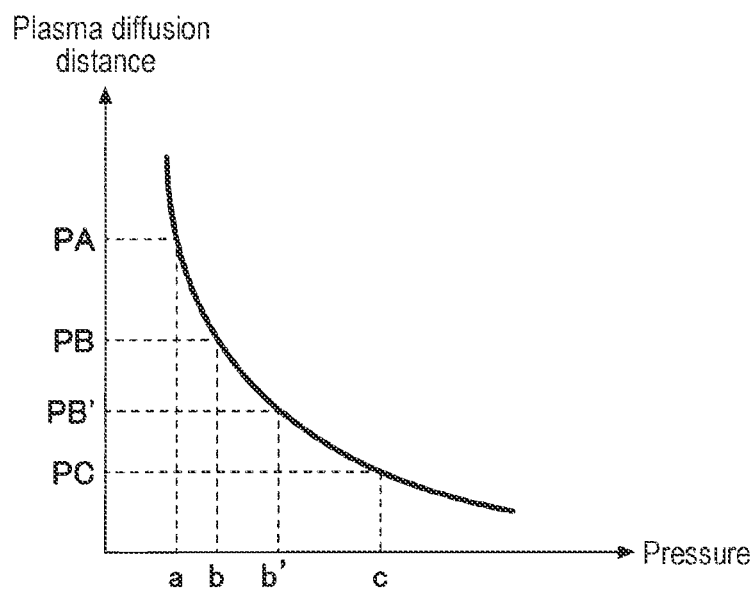
FIG. 4 is a view showing an example of a correlation graph between pressure and plasma diffusion distance according to an embodiment.

For example, correlation data representing the correlation between the pressure and the plasma diffusion distance shown in FIG. 4 are collected and stored in advance in the ROM 5 or the RAM 6 of the controller 3. The plasma diffusion distance indicates, in terms of diameter (p), a diffusion of plasma generated from gas (spreading of plasma) due to the power of microwaves radiated from the dielectric windows 123 and 133 of the microwave radiation part 50.

[Pressure Adjustment]

As shown in FIG. 4, the lower the pressure, the longer the plasma diffusion distance. However, the correlation between the pressure and the plasma diffusion distance is not limited to the curve shown in FIG. 4, and may be represented by a straight line or another curve. For example, when the pressure is a, the plasma diffusion distance (plasma diameter (p)) becomes PA. As shown in FIG. 3, the plasma is formed in a plasma region A having the diameter (p) of PA. At this time, the plasma of the cleaning gas reaches the inner surface of the window part 61 and a portion of the ceiling surface outside the inner surface. As a result, deposits adhering to the inner surface of the window part 61 and the portion of the ceiling surface outside the inner surface can be cleaned.

At this time, microwaves are radiated from the dielectric windows 123 and 133 to the window part 61 and the cleaning gas supplied from the gas holes 60 is ionized and dissociated, so that the plasma indicated in the plasma region A is generated for each window part 61. Therefore, as illustrated in FIG. 2, the entire ceiling surface of the main body 10 and the side surface of the processing container 1 are cleaned by the plasma in the plasma region A generated for the seven window parts 61.

When the pressure is b, which is higher than the pressure a, the plasma diffusion distance (plasma diameter (p)) becomes PB. As shown in FIG. 3, plasma is formed in a plasma region B having the diameter (p) of PB. At this time, the plasma of the cleaning gas reaches the edge of the window part 61 or slightly outward of the edge. As a result, the deposits adhering to the edge of the window part 61 and the inner surface of the window part 61 can be cleaned. At this time, the plasma in the plasma region B has a higher plasma density than that of the plasma in the plasma region A. Therefore, the interior of the window part 61 can be locally and more intensively cleaned than when the plasma in the plasma region A is used.

When the pressure is b', which is higher than the pressure b, the plasma diffusion distance (plasma diameter (p)) becomes PB'. As shown in FIG. 3, plasma is formed in a plasma region B' having the diameter (p) of PB'. At this time, the plasma of the cleaning gas reaches the outside of each gas hole 60 arranged in an annular shape. As a result, the deposits adhering to each gas hole 60 can be cleaned. At this time, the pressure b' is higher than the pressure b. The plurality of gas holes 60 can be locally cleaned by the plasma in the plasma region B', which is generated for the seven window parts 61. In addition, since the plasma density in the plasma region B' is higher than that of the plasma density in the plasma region B, the plurality of gas holes 60 and the insides thereof can be cleaned more intensively than when the plasma in the plasma region B is used.

When the pressure is c, which is higher than the pressure b', the plasma diffusion distance (plasma diameter ($\varphi$)) becomes PC. As shown in FIG. 3, plasma is formed in a plasma region C having the diameter ($\varphi$) of PC. At this time, the plasma of the cleaning gas reaches places outside the dielectric window 123 or 133. As a result, the deposits adhering to the surfaces of the dielectric windows 123 and 133 and the recesses on the edges thereof can be cleaned more intensively.

In such cleaning, the pressure is adjusted according to a size of the cleaning target part, and the plasma density is controlled by controlling the plasma region. Thus, it is possible to perform the cleaning in an effective manner.

A fluctuation amplitude of the pressure may be changed within a range of 100 Pa to 10 Pa in a stepwise manner or in a continuous manner. The minimum pressure when changing the pressure may be 10 Pa. When the internal pressure of the processing container 1 is lowered below the minimum point of discharge according to Paschen's Law, a higher voltage is required for discharge, which makes it is difficult to ignite plasma. When the minimum pressure is 10 Pa or higher, the plasma ignition is possible. Thus, the minimum pressure may be controlled to 10 Pa.

The correlation data between the pressure and the plasma diffusion distance shown in FIG. 4 is stored in the ROM 5 or the RAM 6 in advance. The controller 3 determines a pressure corresponding to the cleaning target part based on the correlation data between the pressure and the plasma diffusion distance. The controller 3 may gradually expand the cleaning range from the local cleaning to the entire cleaning by gradually reducing the pressure and gradually expanding the plasma region. The controller 3 may continuously change the pressure instead of changing the pressure in a stepwise manner. In some embodiments, the controller 3 may repeat the above multiple steps while changing the pressure.

For example, when the cleaning method is executed in the order of the first step and the second step, a second pressure P2 adjusted in the second step and a first pressure P1 adjusted in the first step are adjusted to different pressures. At this time, it is preferable to adjust the second pressure P2 adjusted in the second step to be lower than the first pressure P1 adjusted in the first step so as to gradually or continuously expand the cleaning range.

Further, the cleaning time may be longer in the first step than in the second step. It is preferable to repeat the first step and the second step a predetermined number of times depending on the thickness of the deposits. It is possible to achieve more effective cleaning by repeating the step of performing cleaning from the local cleaning to the entire cleaning, and a subsequent step of performing cleaning from the local cleaning to the entire cleaning.

For example, when the cleaning method is executed in the order of a first step, a second step, and a third step, it is preferable to adjust a third pressure P3 adjusted in the third step such that a relationship of pressure P3<pressure P2<pressure P1 is established. According to this cleaning method, it is possible to effectively clean each part by adjusting the pressure to a pressure corresponding to the size of cleaning target part while supplying the cleaning gas, forming plasma of the cleaning gas that has a size corresponding to that of the cleaning target part, and changing the density of the plasma.

The cleaning time may be longer in the third step than in the first step and longer in the first step than in the second step. The first step, the second step, and the third step may be repeated a predetermined number of times depending on the thickness of deposits. It is possible to perform more effective cleaning by repeating multiple steps of performing cleaning from the local cleaning to the entire cleaning. In this case, the number of repetitions may be changed depending on the thickness of the deposits. During the cleaning, the cleaning situation may be optically measured (e.g., the thickness of the deposits may be optically measured) to detect the end point of the cleaning and to determine the number of repetitions.

The pressure may be increased as the steps progress. However, because each part is locally cleaned and then the entire cleaning is performed, lowering the pressure makes it easier to visualize the state of the local cleaning for each part and to control the number of repetitions of the cleaning and the like. Thus, lowering the pressure is preferable.

[Cleaning Process]

Next, an example of the cleaning process according to an embodiment will be described with reference to FIG. 5. This process is controlled by the controller 3 and is executed by the microwave plasma processing apparatus 100.

When the process is started, the controller 3 supplies the cleaning gas, which is output from the gas source 22, into the processing container 1 through the gas holes 60 (step S10). In addition, the controller 3 radiates the microwave power output from the microwave output part 30 into the processing container 1 from the dielectric windows 123 and 133 of the microwave radiation part 50 (step S10).

Subsequently, the controller 3 adjusts the pressure to a first pressure corresponding to the size (diameter) of the dielectric windows 123 and 133 based on the correlation data stored in the ROM 5 or the RAM 6, and executes the cleaning (step S12). As a result, for example, plasma in the plasma region C illustrated in FIG. 3 is generated so that deposits deposited on the surfaces of the dielectric windows 123 and 133, the uneven portions of the outer edges thereof, and the like, can be locally removed. Step S12 is an example of the first step of adjusting the pressure to the first pressure corresponding to the size of a first cleaning target part.

Subsequently, the controller 3 adjusts the pressure to a second pressure, which is lower than the first pressure and corresponds to the size (diameter) of the window part 61 based on the correlation data, and executes the cleaning (step S14). As a result, for example, plasma in the plasma region B illustrated in FIG. 3 is generated so that deposits deposited on the inner surfaces of the window part 61, the uneven portions of the outer edges thereof, and the like, can be locally removed. Step S14 is an example of the second step of adjusting the pressure to the second pressure, which corresponds to the size of a second cleaning target part and is different from the first pressure, and performing the cleaning.

In addition, between step S12 and step S14, there may be provided a step of adjusting the pressure to a pressure, which is lower than the first pressure and higher than the second pressure and corresponds to the size of the gas holes 60 arranged in an annular shape, and performing the cleaning. In this case, for example, plasma in the plasma region B' illustrated in FIG. 3 is generated so that the gas holes 60 arranged in an annular shape and deposits deposited inside the gas holes 60 can be locally removed.

Subsequently, the controller 3 adjusts the pressure to a third pressure, which is lower than the second pressure and corresponds to the size (diameter) of the wall of the processing container 1 based on the correlation data, and executes the cleaning (step S16). As a result, for example, plasma in the plasma region A illustrated in FIG. 3 is generated so that deposits deposited on the ceiling surface and the side surface of the processing container 1 can be entirely removed. Step S16 is an example of the third step of adjusting the pressure to the third pressure, which corresponds to the size of a third cleaning target part and is different from the first pressure and the second pressure, and performing the cleaning.

The cleaning conditions in steps S12, S14, and S16 are as follows.

<Cleaning Conditions>
Step S12
Pressure: 100 Pa
Microwave power: 3,500 W (=500 W×7 (number of microwave radiation parts))
Cleaning time: 150 (sec)
Gas type: $NF_3$/Ar
Gas flow rate: 1,000/550 (sccm)
Step S14
Pressure: 60 Pa
Microwave power: 3,500 W (=500 W×7)
Cleaning time: 50 (sec)
Gas type: $NF_3$/Ar
Gas flow rate: 1,000/550 (sccm)
Step S16
Pressure: 10 Pa
Microwave power: 3,500 W (=500 W×7)
Cleaning time: 250 (sec)
Gas type: $NF_3$/Ar
Gas flow rate: 350/550 (sccm)

In steps S12, S14, and S16, SiN deposits formed as a pre-coating film are reacted with a $NF_3$ gas and are recovered as a SiF gas, whereby the deposits are removed. When the flow rates of the $NF_3$ gas and the Ar gas are large, the plasma density becomes higher so that plasma is easily ignited. Therefore, the flow rate may be increased in step S12 so as to facilitate the ignition of the plasma, and the flow rate may be decreased in steps S14 and S16.

Subsequently, the controller 3 determines whether steps S12 to S16 have been repeated a predetermined number of times (step S18). When it is determined that the steps have not been repeated the predetermined number of times, the process returns to step S12, and steps S12 to S16 are repeated. For example, the number of repetitions may be two, three, or more times, depending on the thickness of the deposits.

Meanwhile, when it is determined in step S18 that steps S12 to S16 have been repeated the predetermined number of repetitions, the process proceeds to step S20, and a pre-coating film is formed at a predetermined pressure (step S20).

In steps S12 to S16, parts such as the wall surface of the processing container 1, the window parts 61, and the dielectric windows 123 and 133 are effectively cleaned. Therefore, the pre-coating film may be formed in the state in which deposits are not deposited on the entire ceiling surface, the uneven portions, and the side wall of the processing container 1. After forming the pre-coating film, the wafer W is carried into the processing container 1 where a predetermined film is formed on the wafer W (step S22). Then, the process is completed.

According to the cleaning process, in step S12, plasma having a high pressure, a relatively high density and occupying a small region is generated so that cleaning is performed with respect to gaps corresponding to relatively narrow spaces such as the surfaces of the dielectric windows 123 and 133, the uneven portions of the outer edges thereof and the like, and the thick film on the surfaces of the dielectric windows 123 and 133 is removed. Subsequently, in step S14, plasma having an intermediate pressure lower than that in step S12 and an intermediate plasma density and occupying an intermediate region is generated so as to clean the interiors of the window parts 61. Finally, in step S16, plasma having a pressure and a plasma density that are lower than those in step S14 and occupying a large region is generated so as to entirely clean the ceiling surface of the main body 10 and the side surface of the processing container. As a result, it is possible to effectively remove deposits, from thick local deposits to thin entire deposits, by locally removing deposits on a narrow place of the ceiling surface having a number of convex-concave portions, cleaning an intermediate region, and then cleaning the entire region. This makes it possible to improve the coating state of the pre-coating film after the cleaning process, such as adhesion. As a result, it is possible to prevent the pre-coating film from peeling off from the wall of the processing container 1 and falling onto the wafer W to thereby form particles during the film formation performed after the formation of the pre-coating film.

In particular, since the microwave plasma processing apparatus 100 has the configuration in which seven microwave radiation parts 50 are arranged in the main body 10 and a number convex-concave portions are formed in the ceiling surface, it is difficult to clean fine recesses and the like. However, according to the cleaning method, the plasma is generated in a region corresponding to the size of cleaning target part by changing the pressure. As a result, it is possible to perform the cleaning in an effective manner by locally cleaning the fine recesses by generating the plasma having a high density in a small region, and entirely cleaning all of the entire ceiling surface and the entire side wall by generating the plasma having a low density in a large region.

Not only when a plurality of microwave radiation parts 50 are arranged in the main body 10, but also when a single microwave radiation part 50 is arranged in the main body 10, according to the cleaning method, it is possible to perform the cleaning in an effective manner by changing the pressure so as to generate plasma corresponding to the sizes of the single microwave radiation part 50 and a single window part 61 as cleaning objects.

In the cleaning method described above, three steps, i.e. the first step, the second step, and the third step, were executed in order. However, the present disclosure is not limited thereto, and two steps, i.e. the first step and the second step, may be executed in order. In addition, four steps, i.e. the first step, the second step, the third step, and a fourth step, may be executed in order.

For example, an example of cleaning conditions when the four steps are executed in order are as follows.
<Cleaning Conditions>
Example of the First Step
Pressure: 100 Pa
Microwave power: 3,500 W (=500 W×7)
Cleaning time: 100 (sec)
Gas type: $NF_3$/Ar
Gas flow rate: 1,000/550 (sccm)
Example of the Second Step
Pressure: 60 Pa
Microwave power: 3,500 W (=500 W×7)
Cleaning time: 50 (sec)
Gas type: $NF_3$/Ar
Gas flow rate: 1,000/550 (sccm)
Example of the Third Step
Pressure: 25 Pa
Microwave power: 3,500 W (=500 W×7)
Cleaning time: 200 (sec)
Gas type: $NF_3$/Ar
Gas flow rate: 400/550 (sccm)
Example of the Fourth Step
Pressure: 10 Pa Microwave power: 3,500 W (=500 W×7)
Cleaning time: 150 (sec)
Gas type: NF$_3$/Ar
Gas flow rate: 250/550 (sccm)

[Test Results]

Figure 5:
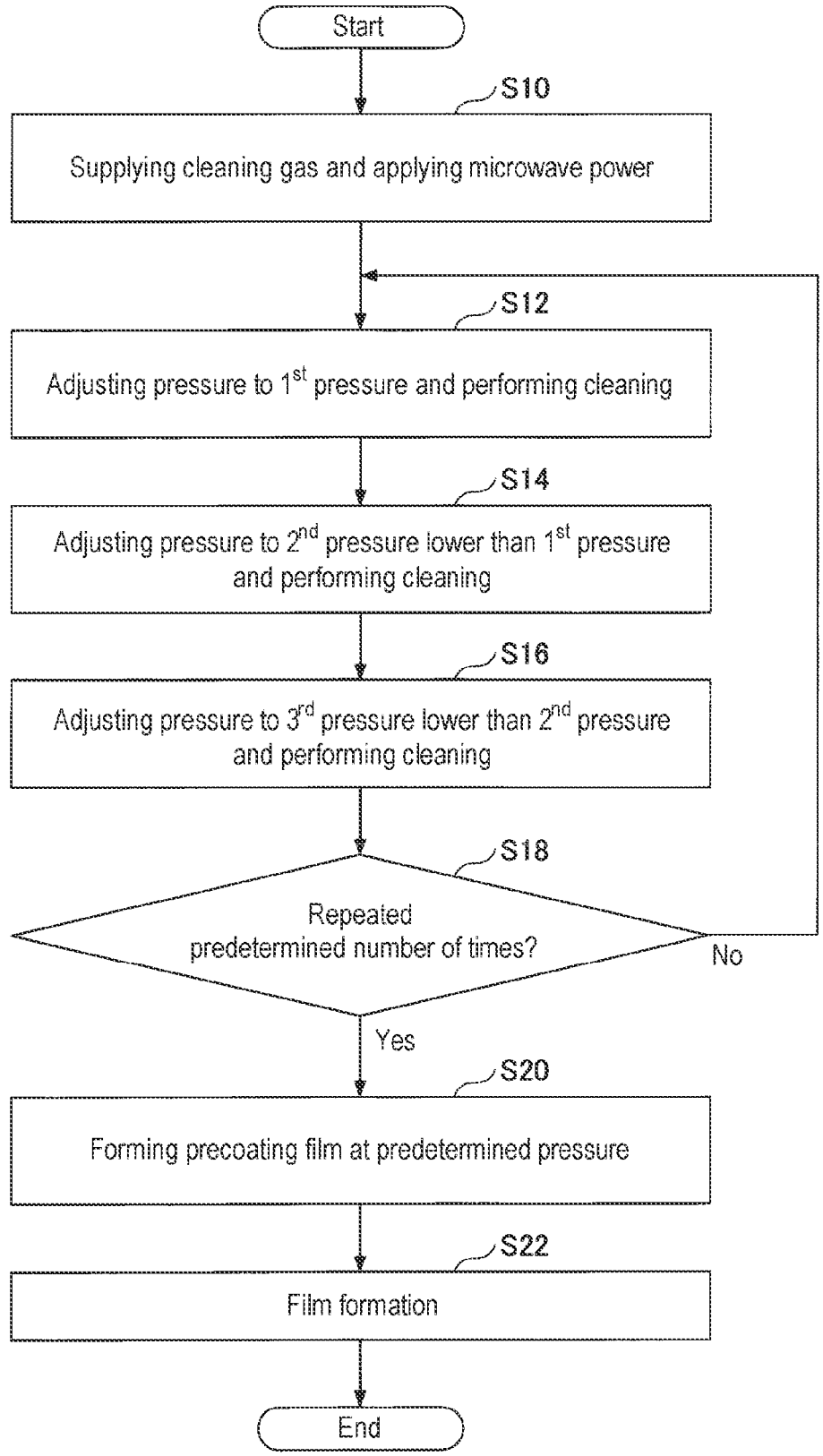
FIG. 5 is a flowchart illustrating an example of a cleaning process according to an embodiment.
Figure 6:
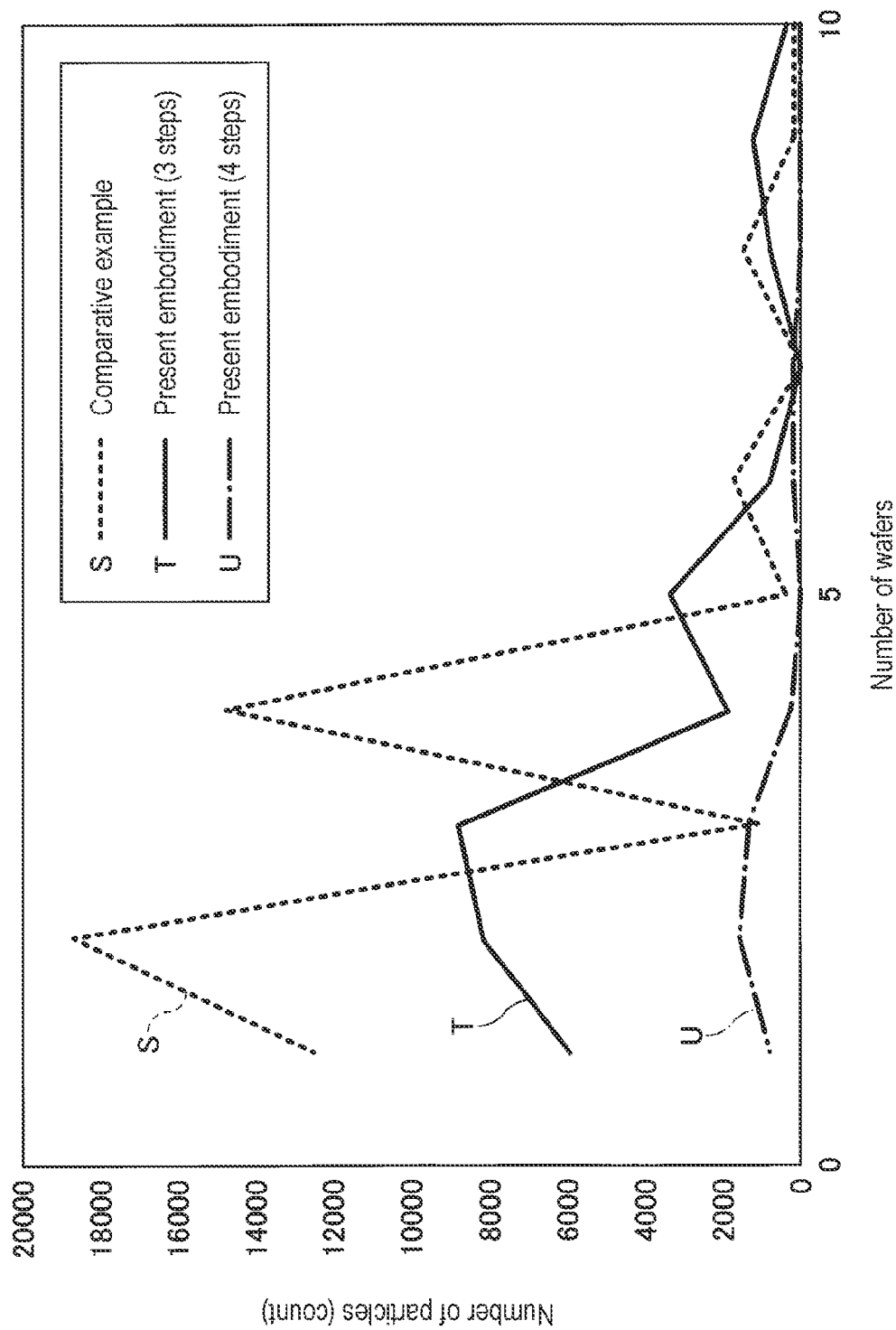
FIG. 6 is a view illustrating an example of results of the cleaning process according to the embodiment.

FIG. 6 is a view representing an example of results of the cleaning method of the embodiment illustrated in FIG. 5. S indicates the results of cleaning according to a comparative example. The cleaning conditions of the comparative example are as follows. Even in the comparative example, the interior of the processing container 1 of the microwave plasma processing apparatus 100 of FIG. 1 was cleaned in the same manner as in the present embodiment.

<Cleaning Conditions of Comparative Example>
Pressure: 10 Pa
Microwave power: 3,500 W (=500 W×7)
Cleaning time: 300 (sec)
Gas type: NF$_3$/Ar
Gas flow rate: 400/1,200 (sccm)

In the comparative example, the pressure was controlled to be constant, and the cleaning was repeated 6 times. That is, the cleaning was performed for 1,800 sec (=300×6). The resulting numbers of particles are shown in the curve S in the comparative example of FIG. 6.

Meanwhile, in one embodiment, the cleaning including a sequence of three steps, i.e. the first step, the second step, and the third step was repeated three times. The resulting numbers of particles are shown in the curve T in the present embodiment (three steps) of FIG. 6.

Meanwhile, in another embodiment, the cleaning including a sequence of four steps, i.e. the first step, the second step, the third step, and the fourth step was repeated three times. The resulting numbers of particles are shown in the curve U in the present embodiment (three steps) of FIG. 6.

In the graph of FIG. 6, the horizontal axis represents the number of wafers and the vertical axis represents the number of particles. An example of test results of the numbers of particles generated from the first to 10th wafers, among the numbers of particles generated when film formation was continuously performed on the first to 25th wafers W, are shown for the case in which the cleaning method of the comparative example was used, the case in the cleaning method of the present embodiment (including the three steps) was used, and the case in which the present embodiment (including the four steps) was used. According to the results, in the curve T and the curve U showing two types of cleaning methods according to the present embodiment, compared with the curve S of the comparative example, the number of particles was particularly reduced in the early stage of running from the first wafer W to the second wafer W or the third wafer W.

From the foregoing, it was proved that the interior of the processing container 1 can be effectively cleaned according to the cleaning method of the present embodiment. In the foregoing, in the cleaning method of sequentially executing the three steps, i.e. the first step, the second step, and the third step, and the cleaning method of sequentially executing four steps, i.e. the first step, the second step, the third step, and the fourth step, the pressure was adjusted to be reduced sequentially for each step.

However, such a pressure adjustment method is not limited to the above. The pressure may be adjusted depending on the size of cleaning target part.

[Modifications]

Next, an example of a cleaning process according to a modification will be described with reference to FIG. 7. FIG. 7 is a flowchart illustrating an example of the cleaning process according to the modification.

When the cleaning process of the modification is started, the controller 3 determines a pressure corresponding to the size of cleaning target part inside the processing container 1 with reference to the correlation graph showing an example in FIG. 4 (step S30). However, as the pressure corresponding to the size of the cleaning target part, a value determined by performing cleaning in advance may be acquired from a storage part such as the RAM 6.

Subsequently, the controller 3 supplies the cleaning gas output from the gas source 22 into the processing container 1 through the gas holes 60, and radiates microwaves from the microwave radiation part 50 into the processing container 1 (step S32).

Subsequently, the controller 3 adjusts the internal pressure of the processing container 1 to the determined pressure, and executes the cleaning (step S34). As a result, plasma in the plasma region corresponding to the size of the cleaning target part is generated so that deposits deposited on the cleaning target part can be effectively removed.

Subsequently, the controller 3 determines whether all cleaning target parts have been cleaned (step S36). When the controller 3 determines that all cleaning target parts have not been cleaned, the controller 3 returns the process to step S30 and repeatedly executes steps S30 to S36 until all cleaning target parts are cleaned.

When the controller 3 determines that all cleaning target parts have been cleaned, the controller 3 forms a pre-coating film at a predetermined pressure (step S40). The pre-coating film is a silicon-containing film of SiN or SiO$_2$ or the like.

In the cleaning method according to the modification, each cleaning target part inside the processing container 1 is effectively cleaned by plasma generated in a plasma region corresponding to the size of each part in steps S30 to S34. Therefore, it is possible to improve the coating state of the pre-coating film. By forming a predetermined film on the wafer W in this state (step S42), it is possible to prevent the pre-coating film from peeling off from the wall of the processing container 1 and falling onto the wafer W to thereby form particles during the film formation in step S42.

As described above, according to the cleaning method using the microwave plasma processing apparatus 100 of the present embodiment, the interior of the processing container 1 is adjusted to have the pressure corresponding to the size of the cleaning target part while supplying the cleaning gas. Then, the cleaning is performed using the plasma of the cleaning gas. As a result, by controlling the internal pressure of the processing container 1, it is possible to perform the local cleaning, the intermediate cleaning, and the entire cleaning. Thus, it is possible to effectively clean all deposits, ranging from deposits in the fine recesses to deposits on the entire surface.

It should be noted that the cleaning methods according to the embodiments disclosed herein are exemplary in all respects and are not restrictive. The above-described embodiments may be replaced or modified in various forms without departing from the scope and spirit of the appended claims. The matters described in the aforementioned embodiments may be combined with each other to provide another configuration unless a conflict arises.

In this specification, the wafer W has been described as an example of a substrate. However, the substrate is not limited thereto, and may be any of various substrates used for a flat panel display (FPD), a printed circuit board, or the like. As the cleaning gas, a halogen gas, such as NF$_3$ and ClF$_3$ or the like may be used.

The present international application claims priority based on Japanese Patent Application No. 2018-111429 filed on Jun. 11, 2018, the disclosure of which is incorporated herein in its entirety by reference.

EXPLANATION OF REFERENCE NUMERALS

1: processing container, 2: microwave plasma source, 3: controller, 10: main body, 11: stage, 14: high-frequency bias power supply, 22: gas source, 30: microwave output part, 40: microwave transmission part, 43*a*: peripheral microwave inlet, 43*b*: central microwave inlet, 44: microwave transmission path, 50: microwave radiation part, 52: outer conductor, 53: inner conductor, 54: slug, 60: gas hole, 61: window part, 100: microwave plasma processing apparatus, 123, 133: dielectric window

What is claimed is:

1. A method for cleaning a microwave plasma processing apparatus which has a processing container and a microwave radiation part, and which has a window part provided at a position where the microwave radiation part is disposed in the processing container, the method comprising:

a cleaning step of adjusting an internal pressure of the processing container, based on a correlation between the internal pressure and a plasma diffusion distance of plasma generated by the microwave radiation part, to a pressure corresponding to the plasma diffusion distance for a plasma region to reach a cleaning target part, among parts within the processing container including a wall surface of the processing container, the microwave radiation part, and the window part, while supplying a cleaning gas, and performing a cleaning process using plasma of the cleaning gas, wherein the cleaning step comprises:

a first step of adjusting the internal pressure to a first pressure, which corresponds to a first plasma diffusion distance for the plasma region to reach a first cleaning target part, and performing the cleaning process; and a second step of adjusting the internal pressure to a second pressure, which corresponds to a second plasma diffusion distance for the plasma region to reach a second cleaning target part having a different size than the first cleaning target part, and is different from the first pressure, and performing the cleaning process.

2. The method of claim 1, wherein the cleaning process is performed by performing the first step and the second step in this order, and the second pressure is lower than the first pressure.

3. The method of claim 2, wherein a cleaning time of the first step is longer than a cleaning time of the second step.

4. The method of claim 1, wherein the first step and the second step are repeated a predetermined number of times.

5. The method of claim 1, wherein the cleaning step further comprises:

a third step of adjusting the internal pressure to a third pressure, which corresponds to a third plasma diffusion distance for the plasma region to reach a third cleaning target part that is different from the first cleaning target part and the second cleaning target part, and is different from the first pressure and the second pressure, and performing the cleaning process.

6. The method of claim 5, wherein the cleaning process is performed by performing the first step, the second step, and the third step in this order, and the third pressure is lower than the second pressure, and the second pressure is lower than the first pressure.

7. The method of claim 5, wherein a cleaning time of the third step is longer than the cleaning time of the first step, and the cleaning time of the first step is longer than the cleaning time of the second step.

8. The method of claim 5, wherein the first step, the second step, and the third step are repeated a predetermined number of times.

9. The method of claim 1, wherein the pressure corresponding to the plasma diffusion distance for the plasma region to reach the cleaning target part is adjusted to another pressure corresponding to a diameter of the plasma region that corresponds to a size of the cleaning target part.

10. The method of claim 1, wherein the pressure corresponding to the cleaning target part is in a range of 10 Pa to 100 Pa.

11. The method of claim 1, wherein a pre-coating film is formed after the cleaning step.

12. The method of claim 1, wherein the parts within the processing container include a plurality of gas holes arranged in an annular shape within the window part and outside the microwave radiation part.

* * * * *